US011177408B2

(12) United States Patent
Yasuda et al.

(10) Patent No.: US 11,177,408 B2
(45) Date of Patent: Nov. 16, 2021

(54) LIGHT DETECTION DEVICE

(71) Applicants: Kabushiki Kaisha Toshiba, Tokyo (JP); Toshiba Electronic Devices & Storage Corporation, Tokyo (JP)

(72) Inventors: Kensuke Yasuda, Yokohama Kanagawa (JP); Nobuyuki Toda, Kawasaki Kanagawa (JP); Shinji Kawahara, Yokohama Kanagawa (JP); Kazuaki Yamaura, Yokohama Kanagawa (JP); Takeshi Yamamoto, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/566,480

(22) Filed: Sep. 10, 2019

(65) Prior Publication Data
US 2020/0303580 A1 Sep. 24, 2020

(30) Foreign Application Priority Data
Mar. 19, 2019 (JP) .............................. JP2019-050629

(51) Int. Cl.
*H01L 31/107* (2006.01)
*H01L 27/144* (2006.01)
*H01L 27/146* (2006.01)

(52) U.S. Cl.
CPC ........ *H01L 31/107* (2013.01); *H01L 27/1446* (2013.01); *H01L 27/14605* (2013.01); *H01L 27/14636* (2013.01)

(58) Field of Classification Search
CPC .............. H01L 31/107; H01L 27/1446; H01L 27/14636; H01L 27/14605; H01L 27/1443;
(Continued)

(56) References Cited

U.S. PATENT DOCUMENTS 8,008,741 B2  8/2011 Yamamura et al.
2015/0333095 A1* 11/2015 Fallica .............. H01L 27/14643
                                                          250/208.1
(Continued)

FOREIGN PATENT DOCUMENTS

JP    2008-103614 A   5/2008
JP       5983076 B2   8/2016
(Continued)

*Primary Examiner* — Shahed Ahmed
(74) *Attorney, Agent, or Firm* — Allen & Overy, LLP

(57) ABSTRACT

A light detection device is disclosed. A first cell and a second cell are set in the light detection device. The first cell and the second cell are mutually adjacent. The device includes: a first semiconductor layer of a first conductivity type; a second semiconductor layer provided on the first semiconductor layer, the second semiconductor layer being of a second conductivity type; a first member provided between the first cell and the second cell; a second member provided between the first member and the first cell; and a third member provided between the first member and the second cell. The first to third members are made of a material different from the first semiconductor layer and the second semiconductor layer.

16 Claims, 16 Drawing Sheets

(58) Field of Classification Search
CPC ......... H01L 31/035272; H01L 27/3269; H01L 27/14643–14663; H01L 29/765–76891; G01S 17/00–95

See application file for complete search history.

(56) References Cited

U.S. PATENT DOCUMENTS

| | | | |
|---|---|---|---|
| 2018/0206804 A1 | 7/2018 | Kawata et al. | |
| 2019/0312070 A1* | 10/2019 | Piemonte | H01L 31/02027 |
| 2019/0319159 A1* | 10/2019 | Mazzillo | H01L 31/035281 |
| 2020/0259026 A1* | 8/2020 | Cadugan | H01L 31/1804 |
| 2020/0379133 A1* | 12/2020 | Burr | G01T 1/2921 |

FOREIGN PATENT DOCUMENTS

| | | |
|---|---|---|
| JP | 2018-121164 A | 8/2018 |
| JP | 6454373 B2 | 1/2019 |

* cited by examiner

LIGHT DETECTION DEVICE

CROSS-REFERENCE TO RELATED APPLICATIONS

This application is based upon and claims the benefit of priority from the prior Japanese Patent Application No. 2019-050629, filed on Mar. 19, 2019; the entire contents of which are incorporated herein by reference.

FIELD

Embodiments relate to a light detection device.

BACKGROUND

Conventionally, a SiPM (Silicon Photomultiplier; a silicon photomultiplier tube) has been developed as a light detection device that detects faint light, in which multiple cells are arranged, and an avalanche photodiode (APD) is provided in each cell. It is desirable to increase the detection accuracy of such a light detection device.

DETAILED DESCRIPTION

In general, according to one embodiment, a light detection device is disclosed. A first cell and a second cell are set in the light detection device. The first cell and the second cell are mutually adjacent. The device includes a first semiconductor layer of a first conductivity type; a second semiconductor layer provided on the first semiconductor layer, the second semiconductor layer being of a second conductivity type; a first member provided between the first cell and the second cell, the first member being made of a material different from the first semiconductor layer and the second semiconductor layer; a second member provided between the first member and the first cell, the second member being made of a material different from the first semiconductor layer and the second semiconductor layer; and a third member provided between the first member and the second cell, the third member being made of a material different from the first semiconductor layer and the second semiconductor layer.

First Embodiment

A first embodiment will now be described.

Figure 1:
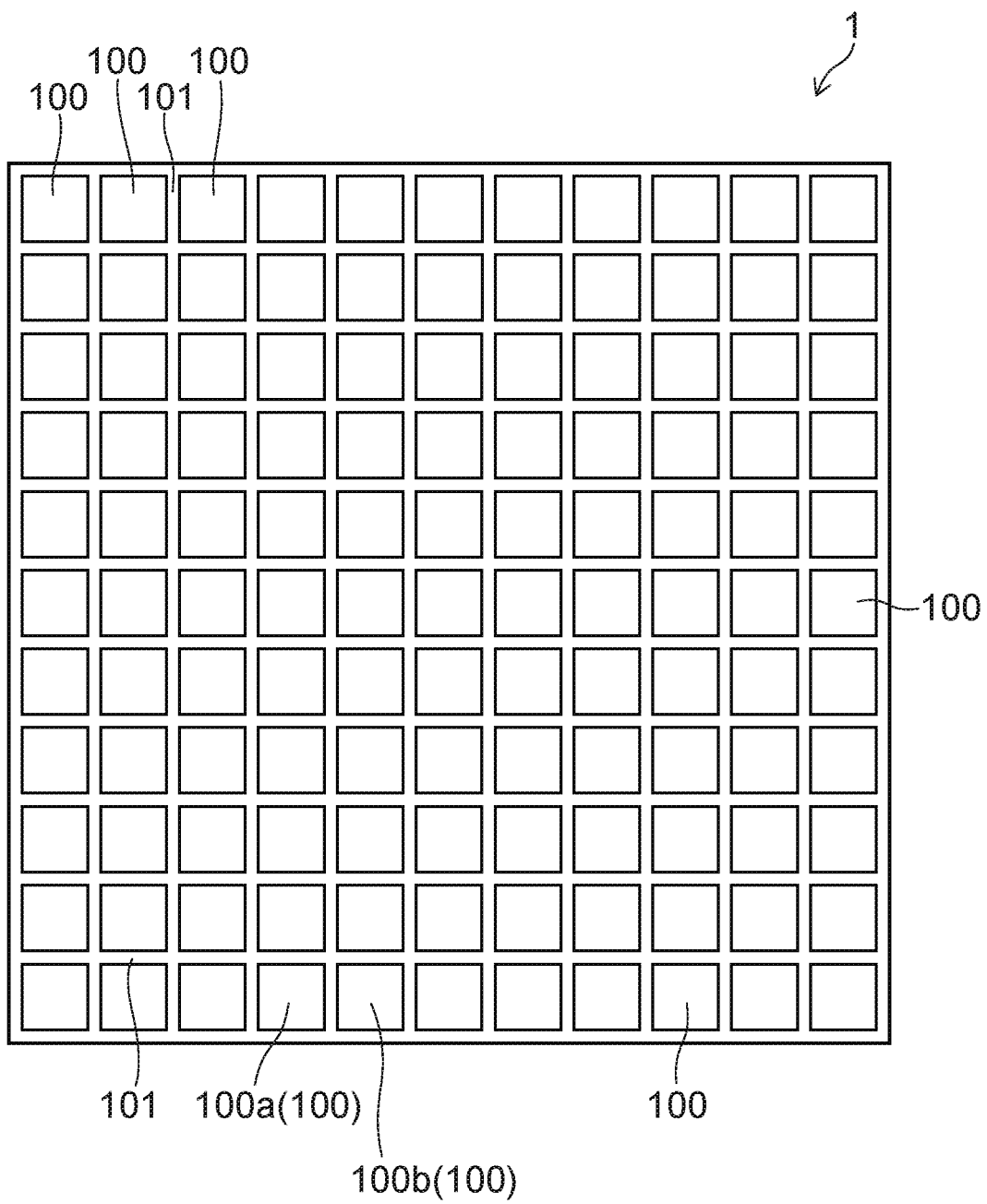
FIG. 1 is a plan view showing a light detection device according to a first embodiment.

FIG. 1 is a plan view showing a light detection device according to the embodiment.

Figure 2:
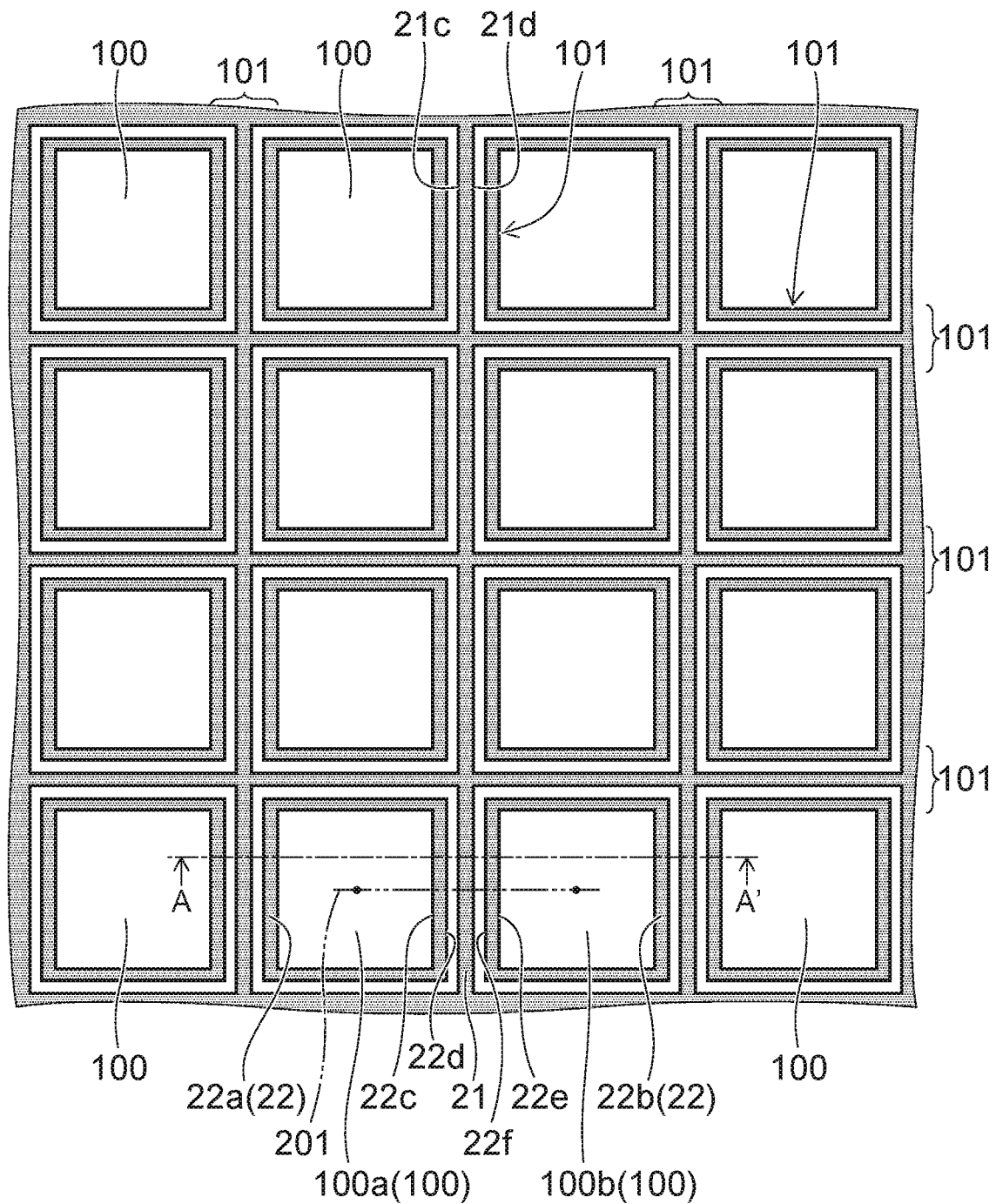
FIG. 2 is a partially enlarged plan view showing the light detection device according to the first embodiment.

FIG. 2 is a partially enlarged plan view showing the light detection device according to the embodiment.

Figure 3:
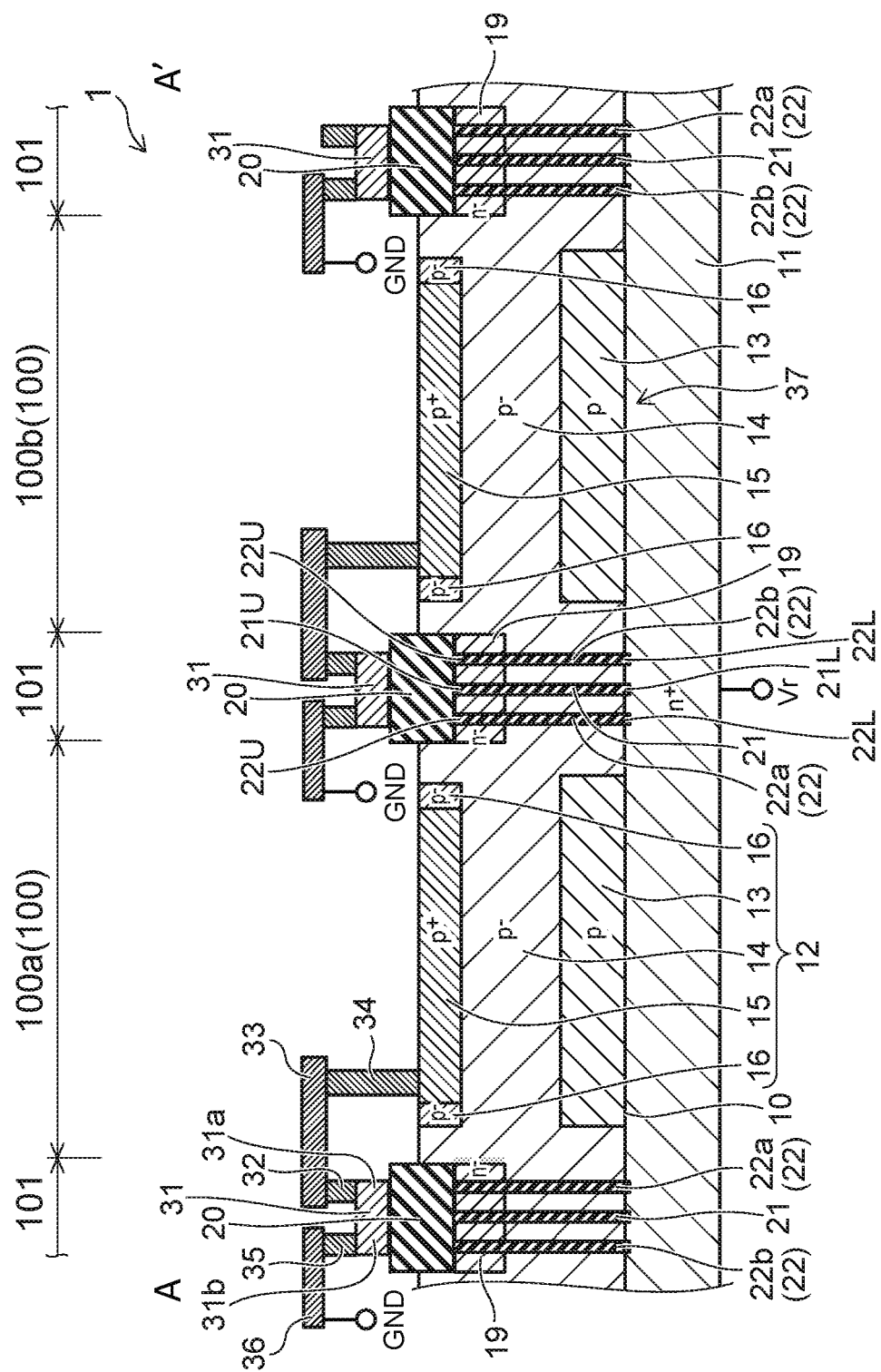
FIG. 3 is a cross-sectional view along line A-A' shown in FIG. 2.

FIG. 3 is a cross-sectional view along line A-A' shown in FIG. 2.

Figure 4:
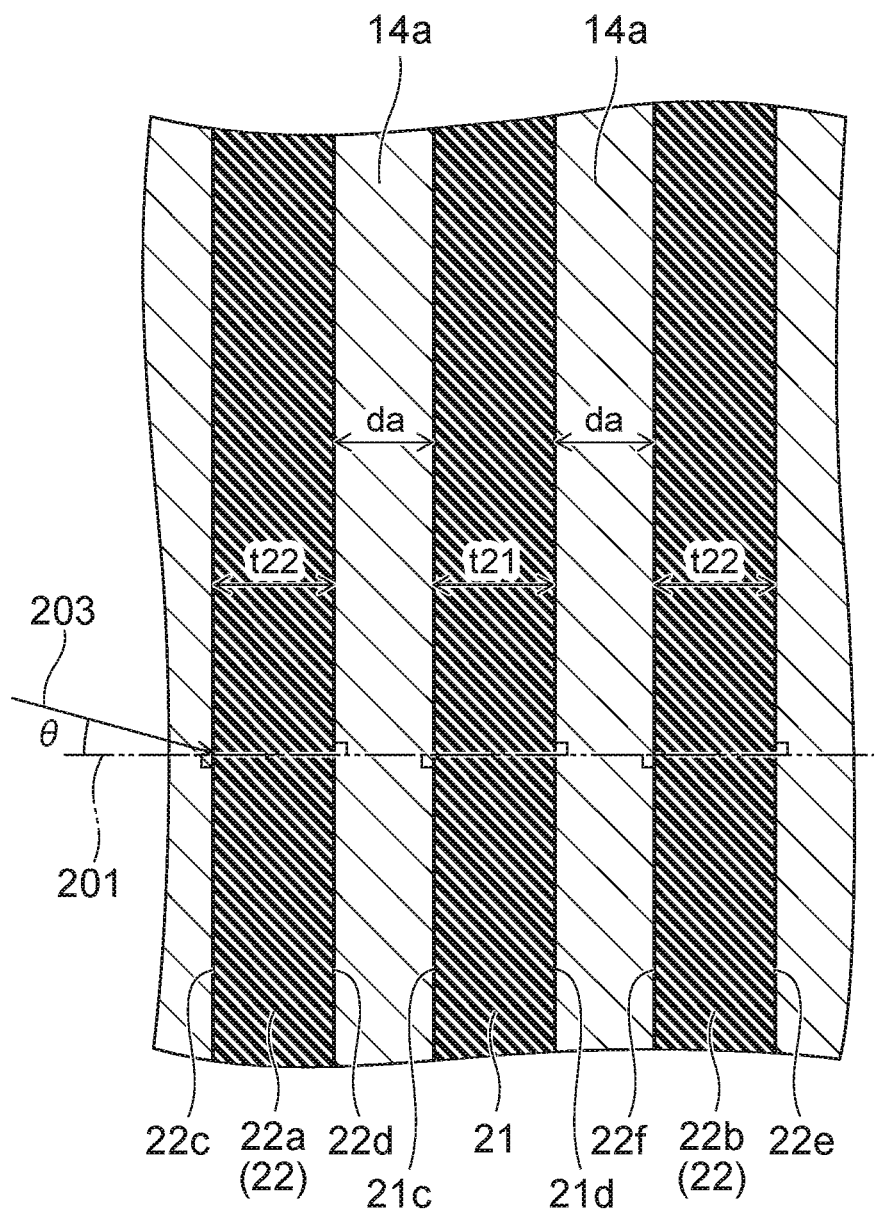
FIG. 4 is a partially enlarged cross-sectional view showing an element separation region of the light detection device according to the first embodiment.

FIG. 4 is a partially enlarged cross-sectional view showing an element separation region of the light detection device according to the embodiment.

Figure 5:
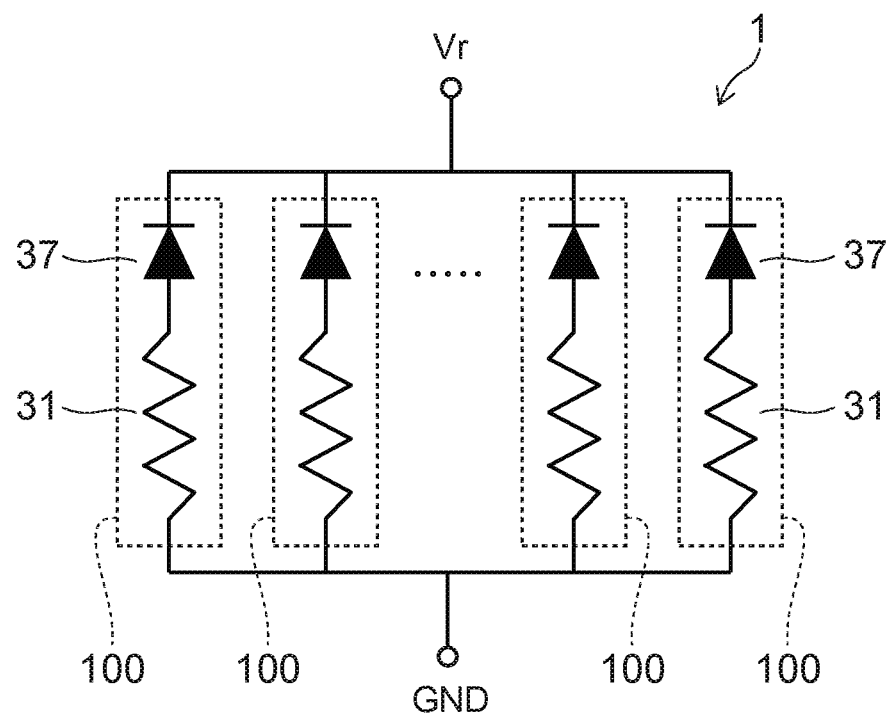
FIG. 5 is a circuit diagram showing the light detection device according to the first embodiment.

FIG. 5 is a circuit diagram showing the light detection device according to the embodiment.

The drawings are schematic and are abbreviated or enhanced as appropriate. The vertical:horizontal ratios, etc., of the components do not always match between the drawings. This is similar for the other drawings described below as well.

The light detection device 1 according to the embodiment is, for example, a SiPM.

As shown in FIG. 1, multiple cells 100 are provided in the light detection device 1 according to the embodiment. For example, the multiple cells 100 are arranged in a matrix configuration. An element separation region 101 is provided between the cells 100. In an example, several tens to several thousands of cells 100 are provided in the light detection device 1. When viewed from above, the configuration of the cell 100 is a rectangle, e.g., a square; and the length of one side of the cell 100 is about several tens to one hundred μm. When viewed from above, the element separation region 101 has a lattice configuration surrounding each of the cells 100. Two mutually-adjacent cells 100 of the multiple cells 100 provided in the light detection device 1 also are called a "cell 100a" and a "cell 100b."

As shown in FIG. 2 and FIG. 3, an $n^+$-type substrate 11 of the $n^+$-conductivity type is provided in the light detection device 1. The $n^+$-type substrate 11 is, for example, a single-crystal silicon substrate. A p-type semiconductor layer 12 of the p-conductivity type is provided on the $n^+$-type substrate 11. The p-type semiconductor layer 12 is, for example, an epitaxial layer of silicon. The contact surface between the $n^+$-type substrate 11 and the p-type semiconductor layer 12 is a p-n interface 10.

In the embodiment, the direction from the $n^+$-type substrate 11 toward the p-type semiconductor layer 12 is called "up" and the direction from the p-type semiconductor layer 12 toward the n⁺-type substrate 11 is called "down;" but these notations are for convenience and are independent of the direction of gravity. "Up" and "down" also may be generally referred to as the "vertical direction." In the specification, "when viewed from above" means an observation along the line of sight in a direction downward from above.

A p-type region 13, a p⁻-type region 14, a p⁺-type region 15, and a p⁻-type region 16 are provided in the p-type semiconductor layer 12. The p-type region 13, the p⁺-type region 15, and the p⁻-type region 16 are provided only inside the cells 100 and are not provided in the element separation region 101. The p-type region 13 contacts the n⁺-type substrate 11. The p⁻-type region 14 is provided on the n⁺-type substrate 11 and on the p-type region 13, covers the p-type region 13, and contacts the n⁺-type substrate 11 and the p-type region 13. The p⁻-type region 15 is provided on the p⁻-type region 14, contacts the p⁻-type region 14, and is exposed at the upper surface of the p-type semiconductor layer 12. The p⁻-type region 16 is provided in a frame-like configuration surrounding the p⁺-type region 15 and contacts the p⁺-type region 15 and the p⁻-type region 14. Therefore, the n⁺-type substrate 11, the p-type region 13, the p⁻-type region 14, and the p⁺-type region 15 are arranged in this order upward from below at the central portion of the cell 100.

In the specification, the "p⁺-type" means that the conductivity type is the p-type, and the impurity concentration is higher than that of the "p-type;" and the "p⁻-type" means that the conductivity type is the p-type, and the impurity concentration is lower than that of the "p-type." Similarly, the "n⁺-type" means that the conductivity type is the n-type, and the impurity concentration is higher than that of the "n-type;" and the "n⁻-type" means that the conductivity type is the n-type, and the impurity concentration is lower than that of the "n-type." The "impurity concentration" refers to the concentration of the impurities contributing to the conductivity of the semiconductor material, and refers to the effective concentration excluding the cancelled portion of the donors and the acceptors in the case where both an impurity that forms donors and an impurity that forms acceptors are included in the same portion.

In the element separation region 101, an insulating film 20 is provided on the p-type semiconductor layer 12; and an n⁻-type region 19 is provided directly under the insulating film 20. The n⁻-type region 19 contacts the insulating film 20 and is separated from the n⁺-type substrate 11. One plate member 21 and two plate members 22 are provided between the insulating film 20 and the n⁺-type substrate 11. The one plate member 21 and the two plate members 22 are disposed between the two mutually-adjacent cells 100a and cell 100b. In the following description, the plate members 21 and 22 also are generally referred to as simply the "plate members."

The refractive index for light of the plate members is different from the refractive indices for light of the n⁺-type substrate 11 and the p-type semiconductor layer 12. The plate members are made of a material different from the materials of the n⁺-type substrate 11 and the p-type semiconductor layer 12 and are made of, for example, a dielectric. A dielectric is an insulator and is a substance in which the dielectric property is more dominant than the conductivity. In the embodiment, for example, the plate members are made of silicon oxide. The material of the plate member 21 and the material of the plate member 22 may be different. An upper end 21U of the plate member 21 and an upper end 22U of the plate member 22 contact the insulating film 20.

A lower end 21L of the plate member 21 and a lower end 22L of the plate member 22 are positioned inside the n⁺-type substrate 11. In other words, the lower ends 21L and 22L are positioned lower than the p-n interface 10.

The plate member 21 has a lattice configuration surrounding each of the multiple cells 100. The plate member 22 has a frame-like configuration surrounding one cell 100. The plate member 22 is disposed between the plate member 21 and the cell 100. In other words, the plate member 21 further surrounds, from the outside, the multiple plate members 22 respectively surrounding the multiple cells 100. Among the plate members 22, the plate member 22 that surrounds the cell 100a also is called a "plate member 22a;" and the plate member 22 that surrounds the cell 100b also is called a "plate member 22b."

The plate member 22a, the plate member 21, and the plate member 22b are arranged periodically in a cross section including two mutually-adjacent cells 100, e.g., a cross section including the cell 100a and the cell 100b such as that shown in FIG. 3 and FIG. 4. Two side surfaces 21c and 21d of the plate member 21, two side surfaces 22c and 22d of the plate member 22a, and two side surfaces 22e and 22f of the plate member 22b are orthogonal to an imaginary straight line 201 connecting the center of the cell 100a and the center of the cell 100b. The straight line 201 is parallel to the p-n interface 10. The center of the cell 100 refers to, for example, the centroid of the cell 100 when viewed from above and refers to, for example, the intersection of diagonal lines in the case where the configuration of the cell 100 is a rectangle.

As shown in FIG. 4, the thickness of the plate member 21 is taken as t21; and the thickness of the plate member 22 is taken as t22. The thicknesses t21 and t22 are generally referred to as the thickness t. The wavelength that is incident on the plate members is taken as λ; and the refractive index of the plate members for light is taken as $n_1$. $m_1$ is an integer of 0 or more. In such a case, the thickness t substantially satisfies the following Formula 1.

$$t = \frac{m_1 \lambda}{2n_1} + \frac{\lambda}{4n_1} \quad \text{[Formula 1]}$$

Figure 6:
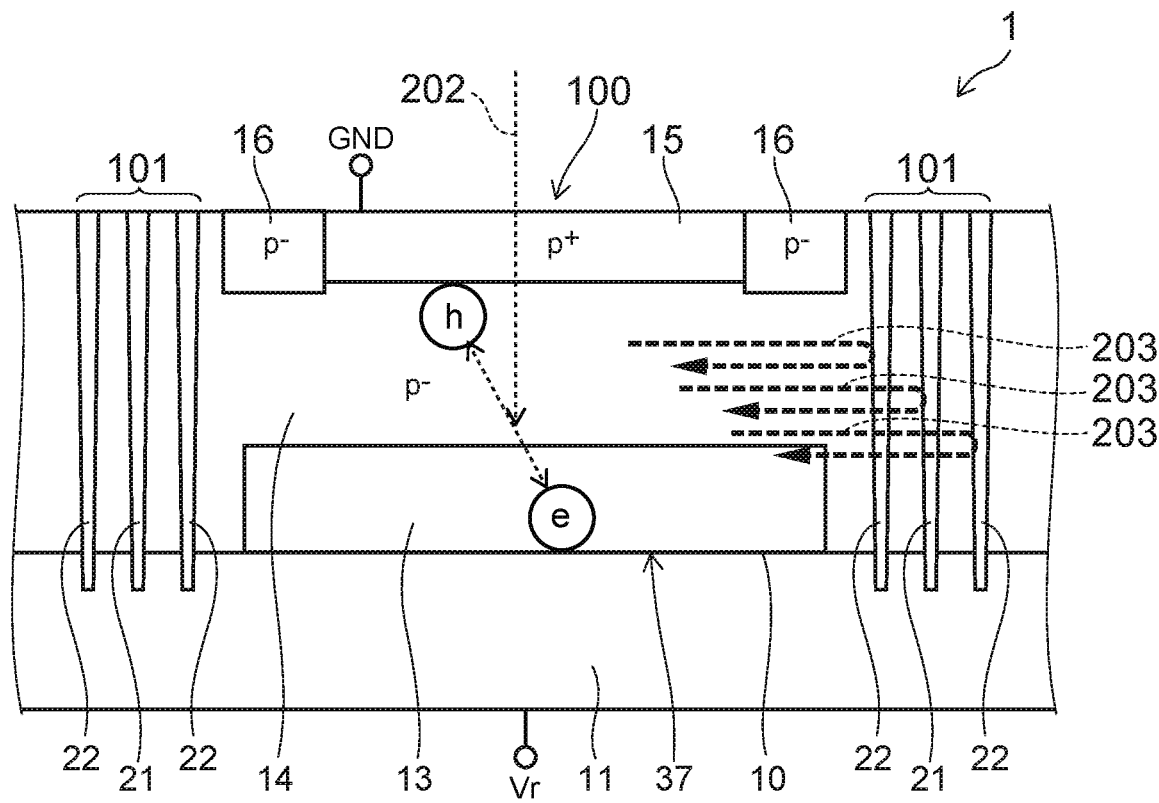
FIG. 6 is a cross-sectional view showing an operation of the light detection device according to the first embodiment.

When the plate members are formed of silicon oxide (SiO₂), the refractive index $n_1$ is 1.457. When the wavelength λ of the light is 900 nm, t=308m₁+154 (nm). For example, in the case where m₁ is 0, t=154 (nm). Accordingly, the thickness t is set to about 154 nm. Although it is favorable for the thickness t of the plate member to be constant, the plate member may have a tapered configuration that becomes thinner downward as illustrated in FIG. 6. The thickness t21 of the plate member 21 and the thickness t22 of the plate member 22 may be different. For example, in the case where the materials of the plate member 21 and the plate member 22 are different, favorable thicknesses t are calculated according to Formula 1 recited above respectively based on the refractive indices of the materials. In such a case, the value of the integer $m_1$ may be different between the plate member 21 and the plate member 22.

The width of a portion 14a of the p⁻-type region 14 between the plate member 21 and the plate member 22 is taken as d. The refractive index of the p⁻-type region 14 for the light described above is taken as $n_2$. $m_2$ is an integer of 0 or more. In such a case, the width d substantially satisfies the following Formula 2.

$$d = \frac{m_2\lambda}{2n_2} + \frac{\lambda}{4n_2} \quad \text{[Formula 2]}$$

In the case where the p⁻-type region 14 is formed of silicon (Si), the refractive index n₂ is 3.882. When the wavelength λ of the light is 900 nm, t=116m₂+58 (nm). For example, in the case where m₂ is 0, t=58 (nm). Accordingly, the width d is set to about 58 nm. Although it is favorable for the width d to be constant, the width d becomes thicker downward in the case where the thickness t of the plate member becomes thinner downward. The width d may be different for each portion 14a of the p⁻-type regions 14. As shown in FIG. 3, a resistance member 31 that is made of, for example, polysilicon is provided on the insulating film 20. One end portion 31a of the resistance member 31 is connected to the p⁺-type region 15 via a contact 32, an interconnect 33, and a contact 34. Another end portion 31b of the resistance member 31 is connected to a ground potential GND via a contact 35 and an interconnect 36. A positive power supply potential Vr is applied to the n⁺-type substrate 11.

Thereby, an avalanche photodiode (APD) 37 is formed of the n⁺-type substrate 11 and the p-type semiconductor layer 12 in the cell 100. As a result, as shown in FIG. 5, the resistance member 31 and the APD 37 are connected in series in the cell 100. In the light detection device 1, the cells 100 are connected in parallel.

The operation of the light detection device according to the embodiment will now be described.

FIG. 6 is a cross-sectional view showing the operation of the light detection device according to the embodiment.

As shown in FIG. 6, when the positive power supply potential Vr is applied to the n⁺-type substrate 11 of the light detection device 1 and the ground potential GND is applied to the p⁺-type region 15 via the resistance member 31 (referring to FIG. 3), a reverse-biased voltage is applied to the APD 37; and a depletion layer (not illustrated) spreads with the p-n interface 10 as a starting point.

When a photon 202 enters the cell 100 in this state, a pair of an electron e and a hole h is generated; the electron e flows toward the n⁺-type substrate 11; and the hole h flows toward the p⁺-type region 15. Thereby, a forward current flows in the APD 37; and avalanche breakdown of the APD 37 occurs. As a result, an avalanche current is generated in the APD 37; the avalanche current flows in the resistance member 31; and a potential difference is generated between the two end portions of the resistance member 31. The light detection device 1 detects the photon 202 entering the cell 100 by detecting the potential difference between the two end portions of the resistance member 31.

At this time, secondary photons 203 are generated inside the cell 100 by the recombination of electron-hole pairs generated by the avalanche breakdown. When the secondary photons 203 are incident on the element separation region 101, the secondary photons 203 are reflected by interference due to the three plate members that are arranged periodically, i.e., the plate member 22, the plate member 21, and the plate member 22. The transmission of the secondary photons 203 through the element separation region 101 can be suppressed thereby. As a result, leakage of the secondary photons 203 generated inside one cell 100 into the adjacent cell 100 through the element separation region 101 can be suppressed; and crosstalk between the cells 100 can be suppressed. In other words, when the photon 202 enters only the cell 100a, the secondary photons 203 that are generated in the cell 100a can be suppressed from entering the adjacent cell 100b, inducing avalanche breakdown in the cell 100b, and causing erroneous detection of the light. Accordingly, the detection accuracy of the light detection device 1 is high.

Modification of First Embodiment

A modification of the first embodiment will now be described.

Figure 7:
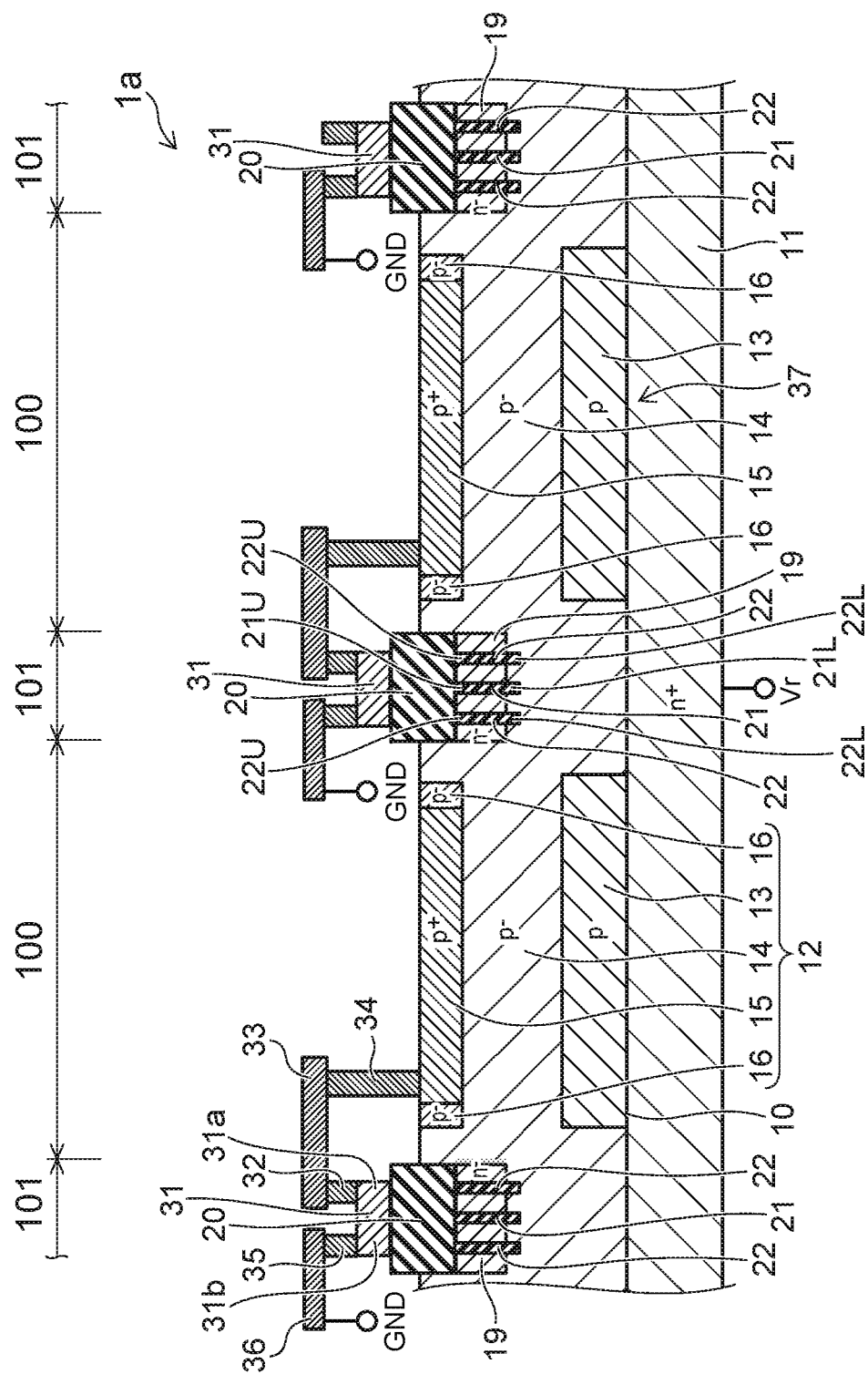
FIG. 7 is a cross-sectional view showing a light detection device according to a modification of the first embodiment.

FIG. 7 is a cross-sectional view showing a light detection device according to the modification.

In the light detection device 1a according to the modification as shown in FIG. 7, the plate members 21 and 22 do not reach the n⁺-type substrate 11 and are separated from the n⁺-type substrate 11. In other words, the lower ends 21L and 22L are positioned higher than the p-n interface 10. However, the lower ends 21L and 22L of the plate members 21 and 22 are positioned lower than the interface between the p⁻-type region 14 and the p⁺-type region 15.

The depletion layer that is generated when the reverse-biased voltage is applied to the APD 37 reaches the vicinity of the interface between the p⁻-type region 14 and the p⁺-type region 15 when at a maximum. Therefore, as long as the plate members 21 and 22 extend to be lower than the interface between the p⁻-type region 14 and the p⁺-type region 15, the effect of reflecting the secondary photons generated inside the depletion layer is obtained. It is easy to manufacture the light detection device 1a according to the modification because the plate members 21 and 22 are shallow. Otherwise, the configuration, the operations, and the effects of the modification are similar to those of the first embodiment.

Second Embodiment

A second embodiment will now be described.

Figure 8:
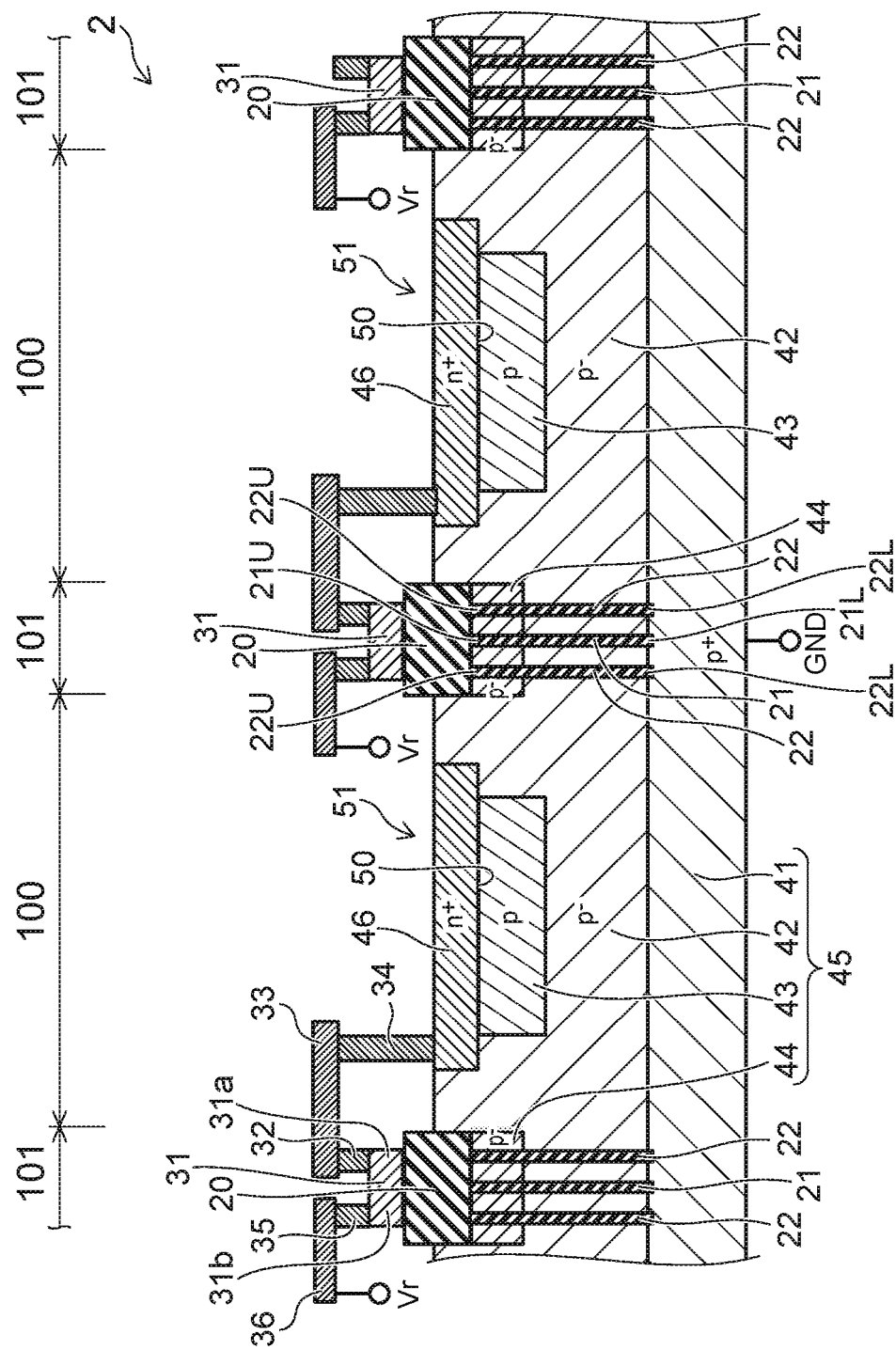
FIG. 8 is a cross-sectional view showing a light detection device according to a second embodiment.

FIG. 8 is a cross-sectional view showing a light detection device according to the embodiment.

As shown in FIG. 8, a p⁺-type substrate 41 of the p⁺-conductivity type is provided in the light detection device 2 according to the embodiment. The p⁺-type substrate 41 is, for example, a single-crystal silicon substrate. A p-type region 42 of the p⁻-conductivity type is provided on the p⁺-type substrate 41. The p⁻-type region 42 is, for example, an epitaxial layer of silicon. The p⁺-type substrate 41 and the p⁻-type region 42 are provided in both the cell 100 and the element separation region 101.

In the cell 100, a p-type region 43 of the p-conductivity type is provided on the p⁻-type region 42. A p⁻-type region 44 of the p⁻-conductivity type also is provided on the p⁻-type region 42 in the element separation region 101. A p-type semiconductor layer 45 is formed of the p⁺-type substrate 41, the p⁻-type region 42, the p-type region 43, and the p⁻-type region 44.

In the cell 100, an n⁺-type semiconductor layer 46 of the n⁺-conductivity type is provided on the p-type region 43. The n⁺-type semiconductor layer 46 contacts the p-type region 43 and the p⁻-type region 42. Therefore, the p⁺-type substrate 41, the p⁻-type region 42, the p-type region 43, and the n⁺-type semiconductor layer 46 are arranged in this order upward from below in the central portion of the cell 100. The interface between the n⁺-type semiconductor layer 46 and the p-type region 43 and the interface between the n⁺-type semiconductor layer 46 and the p⁻-type region 42 form a p-n interface 50. Thereby, in the cell 100, an avalanche photodiode (APD) 51 is formed of the n⁺-type semiconductor layer 46, the p-type region 43, and the p⁻-type region 42.

The insulating film 20 is provided in the element separation region 101. The p⁻-type region 44 contacts the insulating film 20. The plate members 21 and 22 are provided between the p⁺-type substrate 41 and the insulating film 20. The configurations of the plate members 21 and 22 are similar to those of the first embodiment. The lower end 21L of the plate member 21 and the lower end 22L of the plate member 22 are positioned inside the p⁺-type substrate 41. In other words, the lower ends 21L and 22L are positioned lower than the interface between the p⁺-type substrate 41 and the p⁻-type region 42.

The operation of the light detection device 2 according to the embodiment will now be described.

Figure 9:
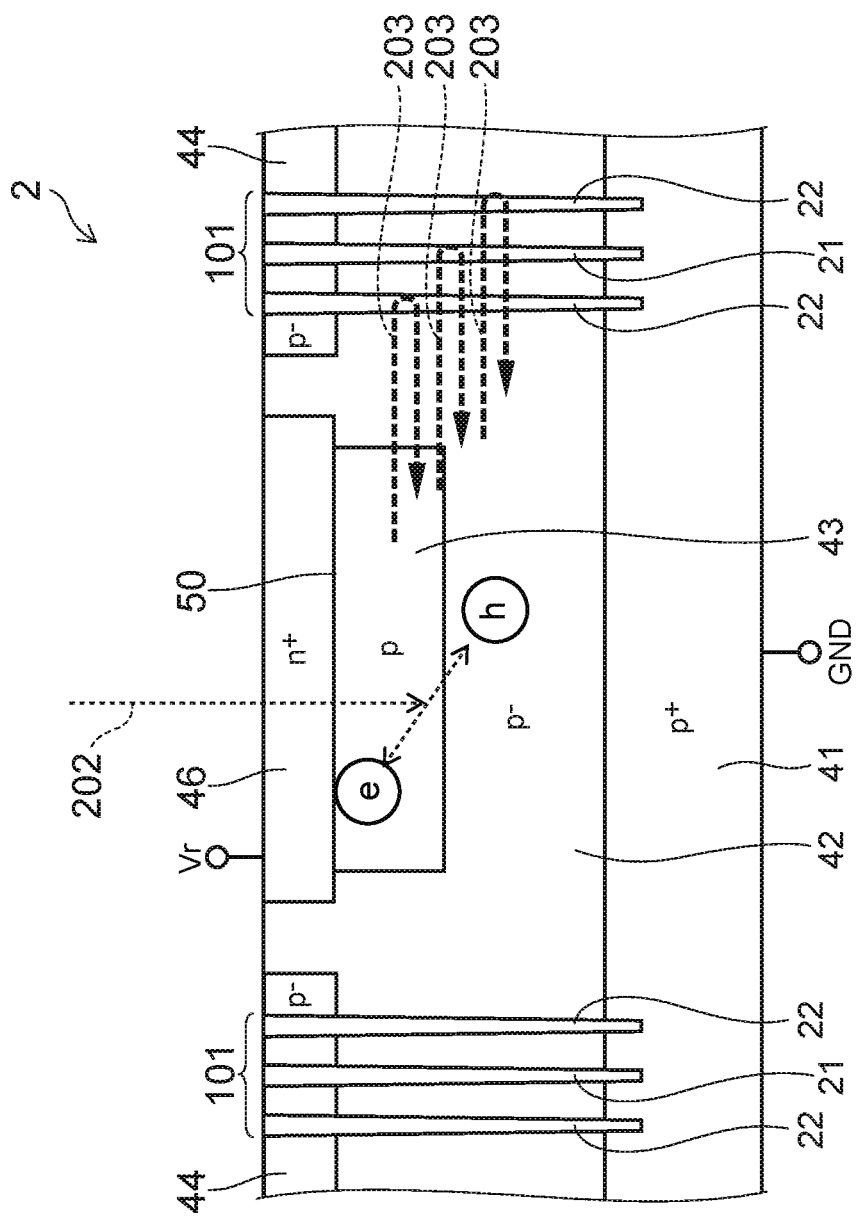
FIG. 9 is a cross-sectional view showing an operation of the light detection device according to the second embodiment.

FIG. 9 is a cross-sectional view showing the operation of the light detection device according to the embodiment.

As shown in FIG. 9, when the ground potential GND is applied to the p⁻-type substrate 41 of the light detection device 2 and the positive power supply potential Vr is applied to the n⁺-type semiconductor layer 46 via the resistance member 31 (referring to FIG. 8), a reverse-biased voltage is applied to the APD 51; and a depletion layer (not illustrated) spreads with the p-n interface 50 as a starting point.

When the photon 202 enters the cell 100 in this state, a pair of the electron e and the hole h is generated; the electron e flows toward the n⁺-type semiconductor layer 46; and the hole h flows toward the p⁻-type substrate 41. Thereby, a forward current flows in the APD 51; and avalanche breakdown of the APD 51 occurs. Thereby, the light detection device 2 detects the incidence of the photon 202 on the cell 100.

At this time, the secondary photons 203 are generated inside the cell 100 by recombination of electron-hole pairs generated by the avalanche breakdown. However, the position where the secondary photons 203 are generated is inside the depletion layer; and the depletion layer spreads with the p-n interface 50 as a starting point; therefore, in the light detection device 2, the position where the secondary photons 203 are generated is higher than the position where the secondary photons 203 are generated in the light detection device 1 according to the first embodiment (referring to FIG. 6). The secondary photons 203 do not leak easily into the adjacent cell 100 because the secondary photons 203 are reflected by the interference due to the plate member 22, the plate member 21, and the plate member 22 provided in the element separation region 101. Therefore, the detection accuracy of the light detection device 2 is high. Otherwise, the configuration, the operations, and the effects of the embodiment are similar to those of the first embodiment.

Modification of Second Embodiment

A modification of the second embodiment will now be described.

Figure 10:
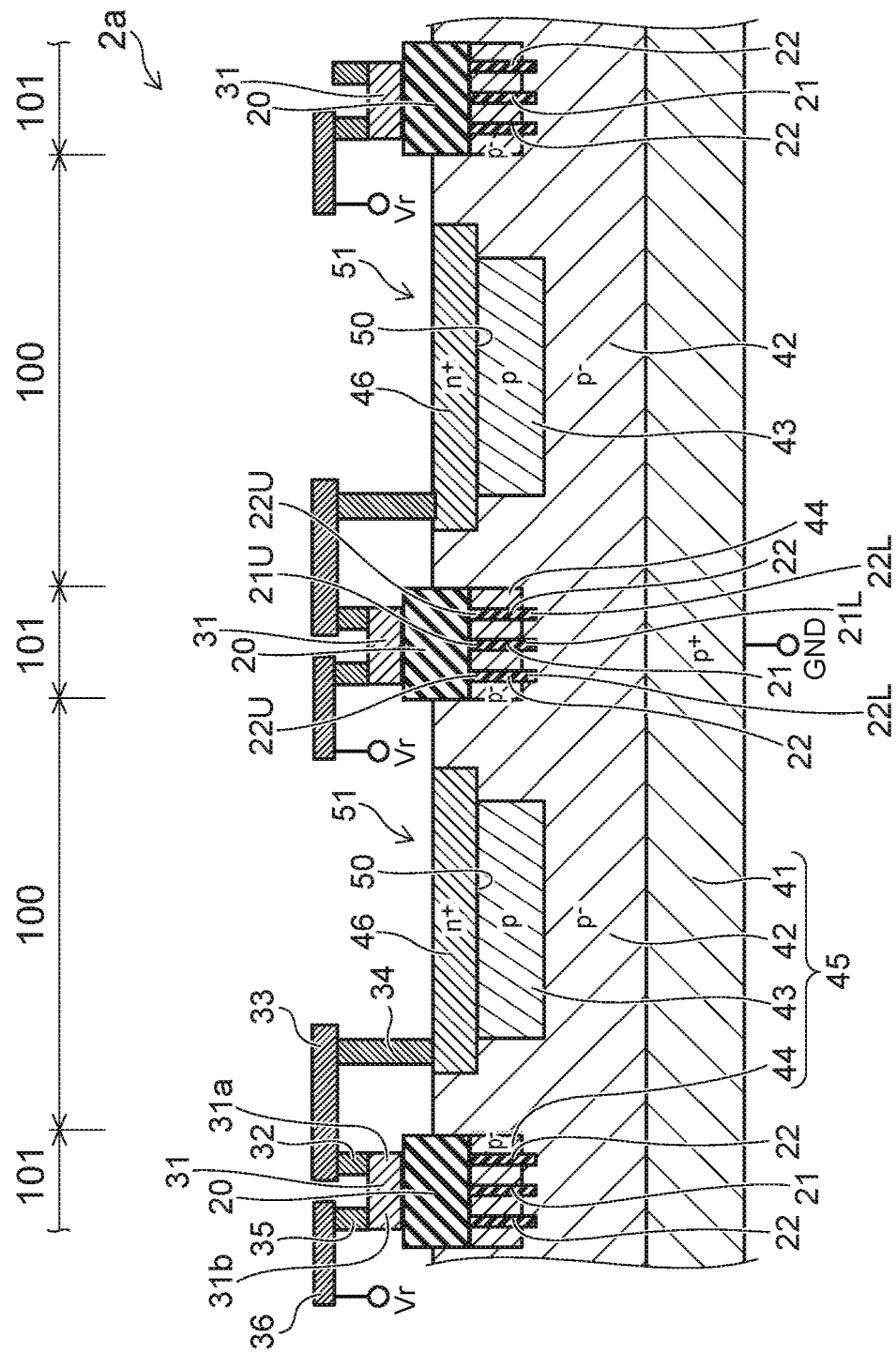
FIG. 10 is a cross-sectional view showing a light detection device according to a modification of the second embodiment.

FIG. 10 is a cross-sectional view showing a light detection device according to the modification.

In the light detection device 2a according to the modification as shown in FIG. 10, the plate members 21 and 22 do not reach the p⁺-type substrate 41 and are separated from the p⁺-type substrate 41. However, the lower ends 21L and 22L of the plate members 21 and 22 are positioned lower than the p-n interface 50 between the p-type region 43 and the n⁺-type semiconductor layer 46.

The depletion layer that is generated when the reverse bias is applied to the APD 51 is generated with the p-n interface 50 as a starting point; therefore, as long as the plate members 21 and 22 extend to be lower than the p-n interface 50, the effect of reflecting the secondary photons generated inside the depletion layer is obtained. It is easy to manufacture the light detection device 2a according to the modification because the plate members 21 and 22 are shallow. Otherwise, the configuration, the operations, and the effects of the modification are similar to those of the second embodiment.

Third Embodiment

A third embodiment will now be described.

Figure 11A:
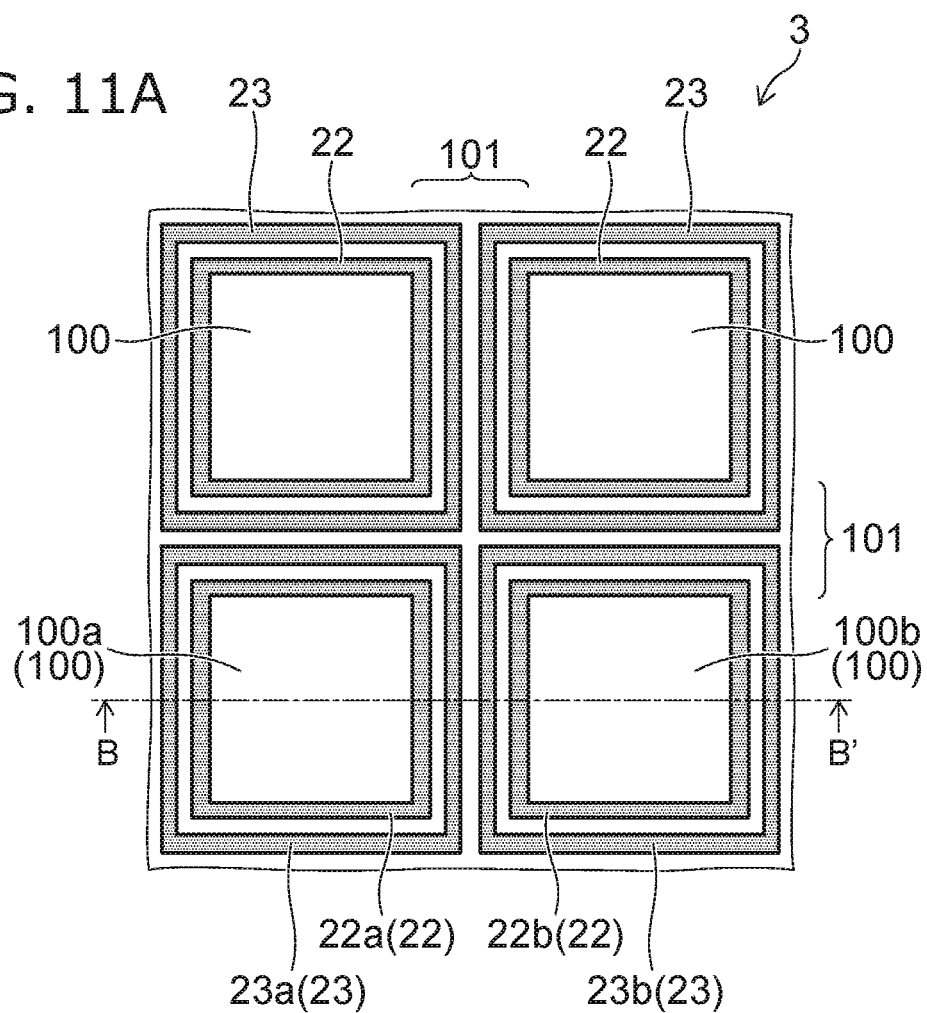
FIG. 11A is a plan view showing a light detection device according to a third embodiment.
Figure 11B:
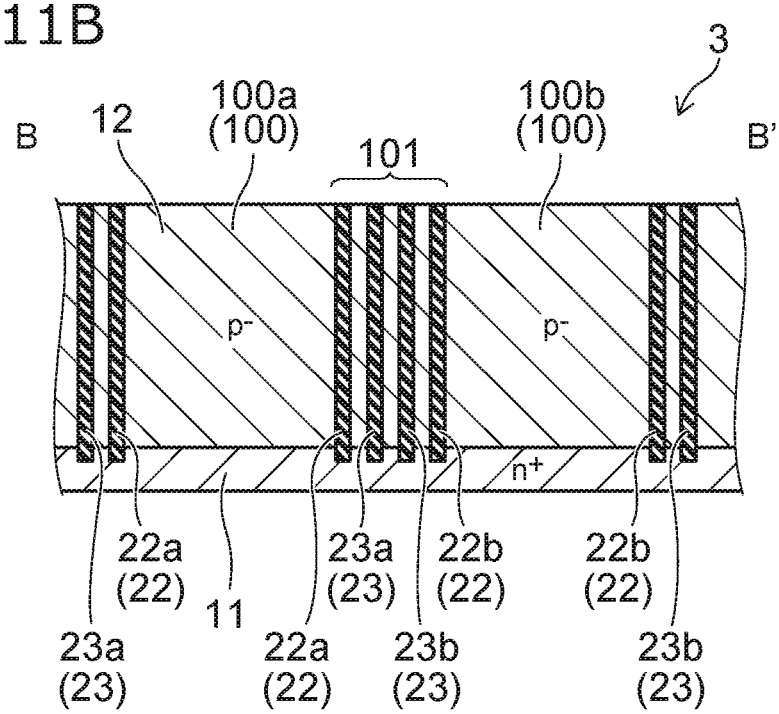
FIG. 11B is a cross-sectional view along line B-B' shown in FIG. 11A.

FIG. 11A is a plan view showing a light detection device according to the embodiment; and FIG. 11B is a cross-sectional view along line B-B' shown in FIG. 11A.

The detailed configuration inside the cell 100 is not illustrated in FIGS. 11A and 11B.

As shown in FIGS. 11A and 11B, the light detection device 3 according to the embodiment differs from the light detection device 1 according to the first embodiment (referring to FIG. 1 to FIG. 6) in that two mutually-separated plate members 23 are provided instead of the plate member 21. The plate members 23 have frame-like configurations and respectively surround the plate members 22; accordingly, the plate member 23 surrounds the cell 100 with the plate member 22 interposed. Among the plate members 23, the plate member 23 that surrounds the plate member 22a and the cell 100a also is called a "plate member 23a;" and the plate member 23 that surrounds the plate member 22b and the cell 100b also is called a "plate member 23b."

The composition of the plate member 23 is substantially the same as the composition of the plate member 22. Also, the positions in the vertical direction of the upper end and the lower end of the plate member 23 are substantially the same as the positions of the upper end and the lower end of the plate member 22. Therefore, four plate members are disposed between the mutually-adjacent cells 100 in the light detection device 3. The plate member 22, the plate member 23, the plate member 23, and the plate member 22 are arranged periodically in a cross section including two mutually-adjacent cells 100. For example, the plate member 22a, the plate member 23a, the plate member 23b, and the plate member 22b are arranged periodically in this order between the cell 100a and the cell 100b.

According to the embodiment, by periodically arranging the four plate members between the mutually-adjacent cells 100, effective interference of the secondary photons can be provided; and the reflection efficiency can be increased further. As a result, the leakage of the secondary photons into the adjacent cell 100 can be suppressed more effectively; and the detection accuracy can be improved further. Otherwise, the configuration, the operations, and the effects of the embodiment are similar to those of the first embodiment.

Although an example is shown in the first and second embodiments in which three plate members are disposed between the mutually-adjacent cells 100, and an example is shown in the embodiment in which four plate members are disposed between the mutually-adjacent cells 100, the invention is not limited thereto; and five or more plate members may be disposed between the mutually-adjacent cells 100. The plate members may have frame-like configurations or lattice configurations.

Fourth Embodiment

A fourth embodiment will now be described.

Figure 12:
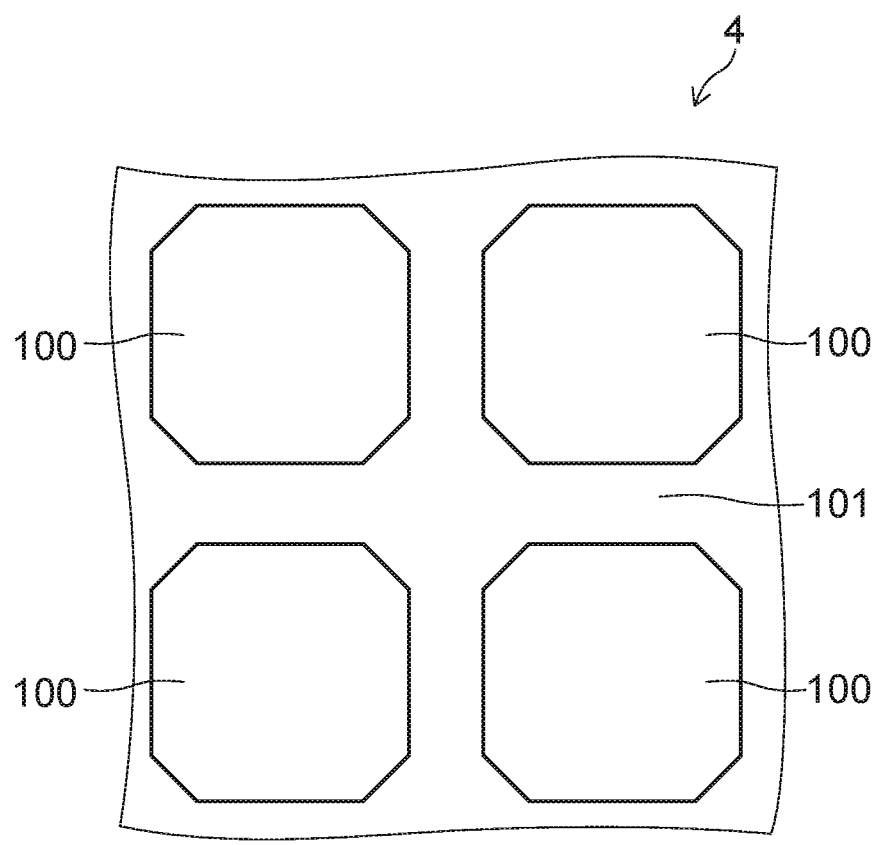
FIG. 12 is a plan view showing a light detection device according to a fourth embodiment.

FIG. 12 is a plan view showing a light detection device according to the embodiment.

The configurations inside the cell 100 and inside the element separation region 101 are not illustrated in FIG. 12.

In the light detection device 4 according to the embodiment as shown in FIG. 12, the configuration of the cell 100 when viewed from above is an octagon. For example, the configuration of the cell 100 is a square having beveled corners. Otherwise, the configuration, the operations, and the effects of the embodiment are similar to those of the first embodiment.

Fifth Embodiment

A fifth embodiment will now be described.

Figure 13:
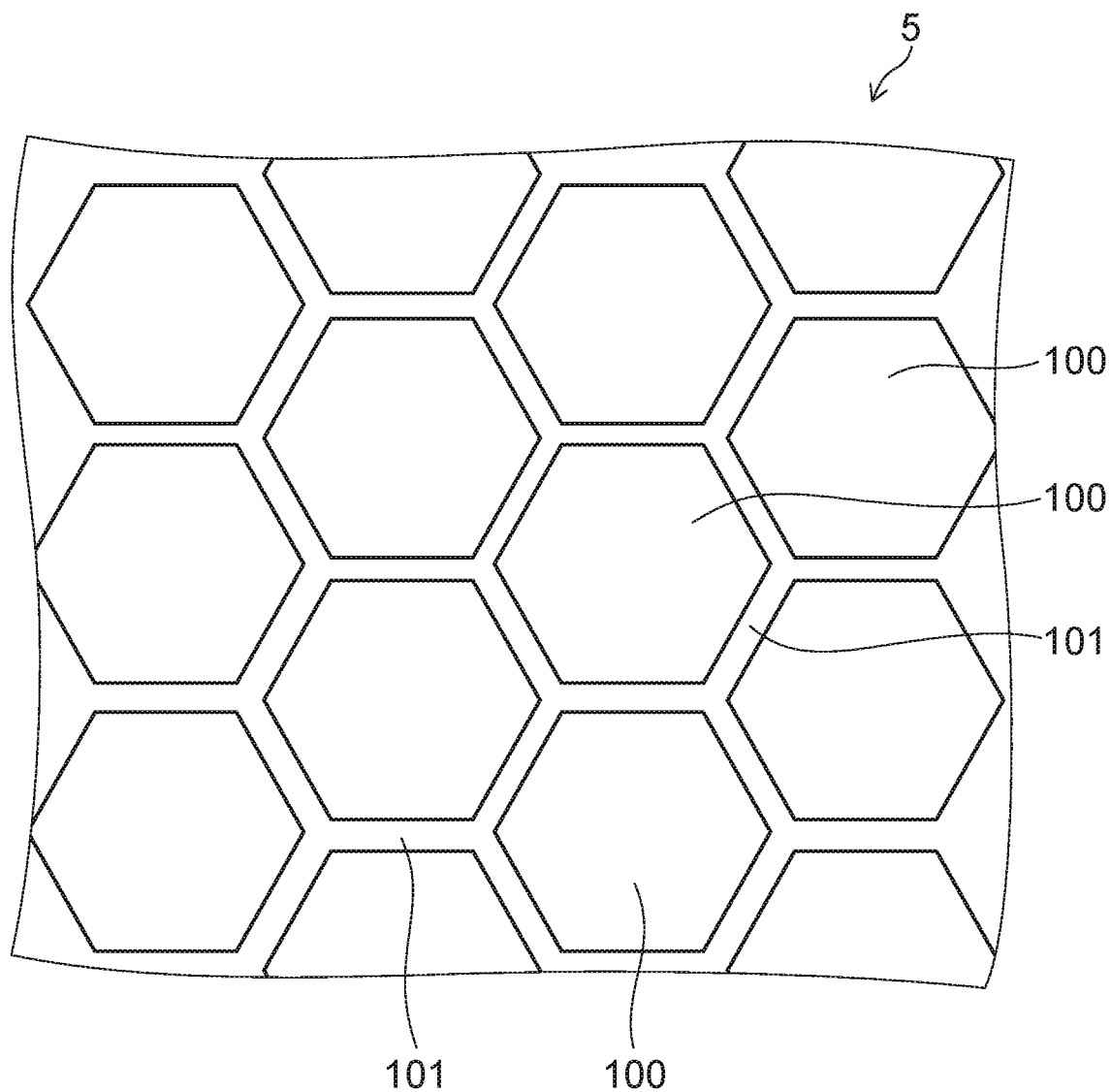
FIG. 13 is a plan view showing a light detection device according to a fifth embodiment.

FIG. 13 is a plan view showing a light detection device according to the embodiment.

The configurations inside the cell 100 and inside the element separation region 101 are not illustrated in FIG. 13.

In the light detection device 5 according to the embodiment as shown in FIG. 13, the configuration of the cell 100 when viewed from above is a hexagon and is arranged in, for example, a honeycomb configuration. The edge length per unit area of the cell 100 when viewed from above can be shortened thereby. As a result, the surface area ratio of the cell 100 in the light detection device 5 can be increased; and the detection accuracy of the light can be improved even more. Otherwise, the configuration, the operations, and the effects of the embodiment are similar to those of the first embodiment.

Although an example is shown in the first to third embodiments described above in which the configuration of the cell 100 when viewed from above is a quadrilateral, an example is shown in the fourth embodiment in which the configuration of the cell 100 is an octagon, and an example is shown in the fifth embodiment in which the configuration of the cell 100 is a hexagon, the configuration of the cell 100 is not limited thereto. The cell 100 can have any configuration, e.g., a polygon, a circle, or an ellipse. Any combination of the embodiments described above is possible. For example, in a light detection device such as that described in the second embodiment in which the depletion layer is formed in the upper portion of the cell, four plate members may be disposed between mutually-adjacent cells as described in the third embodiment, or planar layouts such as those described in the fourth and fifth embodiments may be employed.

The shape of the plate member is not limited to a plate shape. For example, the plate members may be formed by forming a recess in the semiconductor layer and filling the recess with a dielectric. In this case, the shape of the recess depends on the processing conditions. In this case, the thickness of the plate member may become thinner downward. Also in such cases, the length of the plate member in the arrangement direction of the plate members, that is, the direction in which an imaginary straight line connecting the centers of two adjacent cells extends is defined as the thickness of the plate member.

First Test Example

A first test example will now be described.

FIGS. 14A and 14B and FIGS. 15A and 15B are graphs showing simulation results of the light reflectance of the test example, in which the horizontal axis is the secondary photon wavelength, and the vertical axis is the light reflectance in the element separation region.

First, the common conditions of the simulation will be described.

The light detection device was assumed to have a configuration in which three or four plate members are arranged periodically as shown in FIG. 4. The thickness t of the plate member was taken to be uniform between the plate members and within the plate member; and the width d of the semiconductor layer between the plate members also was taken to be uniform. The plate member was made of silicon oxide; and the semiconductor layer was made of silicon. The refractive index $n_1$ of silicon oxide was taken to be 1.457; and the refractive index $n_2$ of silicon was taken to be 3.882.

The angle between the straight line 201 and the incident direction of the secondary photon 203 was taken as θ (°). The straight line 201 is a straight line orthogonal to the two side surfaces of the plate member. For each of the conditions, the solid line shows the case where the thickness t of the plate member and the width d of the portion 14a of the semiconductor layer are the design values, that is, the error is 0%; the single dot-dash line shows the case of the design value+10%, that is, the actual size being 10% larger than the design value; and the broken line shows the case of the design value−10%, that is, the actual size being 10% smaller than the design value.

The individual simulation conditions and results will now be described.

Figure 14A:
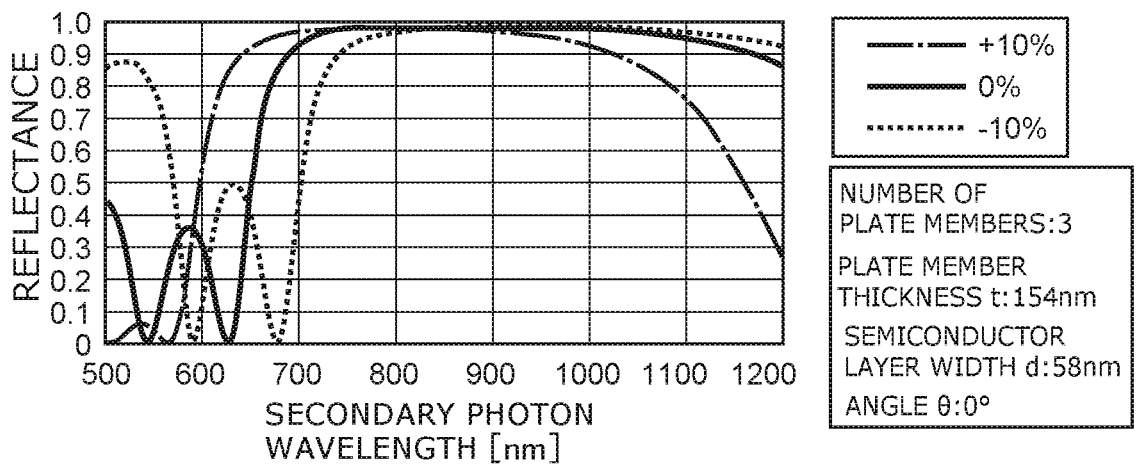
FIGS. 14A and 14B and FIGS. 15A and 15B are graphs showing simulation results of a light reflectance of a first test example, in which a horizontal axis is a secondary photon wavelength, and a vertical axis is a light reflectance in an element separation region.
Figure 14B:
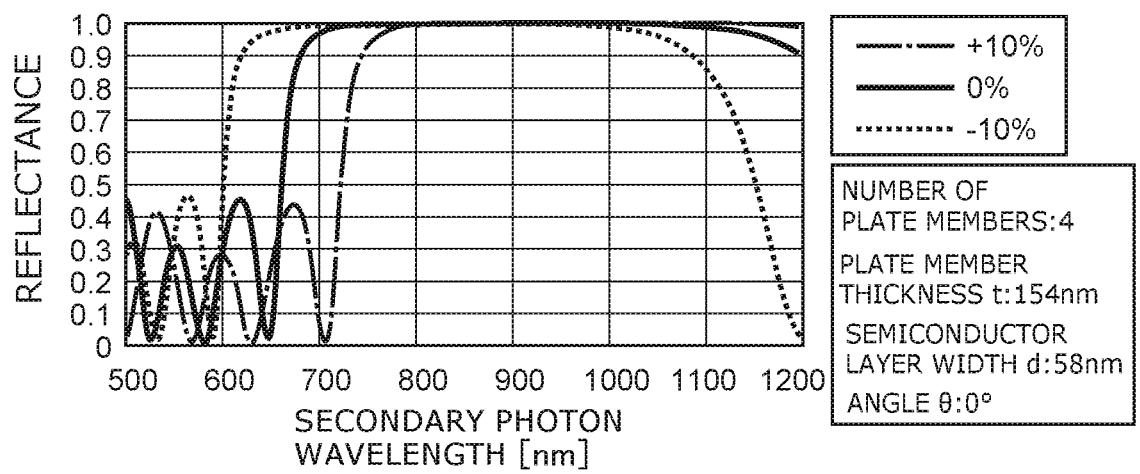

FIGS. 14A and 14B show the case where the thickness t of the plate member is 154 nm, the width d of the portion 14a of the semiconductor layer is 58 nm, and the angle θ is 0°. These values of the thickness t and the width d satisfy Formulas 1 and 2 described above when the wavelength λ of the light is 900 nm and the integers $m_1$ and $m_2$ are 0. FIG. 14A shows the case of three plate members; and FIG. 14B shows the case of four plate members.

As shown in FIGS. 14A and 14B, for the conditions recited above, in the case where the thickness t and the width d are the design values (0%), the reflectance was not less than 0.95 in the range where the wavelength λ was substantially not less than 700 nm and not more than 1100 nm. In the case where the thickness t and the width d were the design value+10% and the design value−10% as well, for three plate members (FIG. 14A), the reflectance was not less than 0.8 in the range where the wavelength λ was substantially not less than 730 nm and not more than 1080 nm; and for four plate members (referring to FIG. 14B), the reflectance was not less than 0.8 in the range where the wavelength λ was substantially not less than 740 nm and not more than 1120 nm.

Figure 15A:
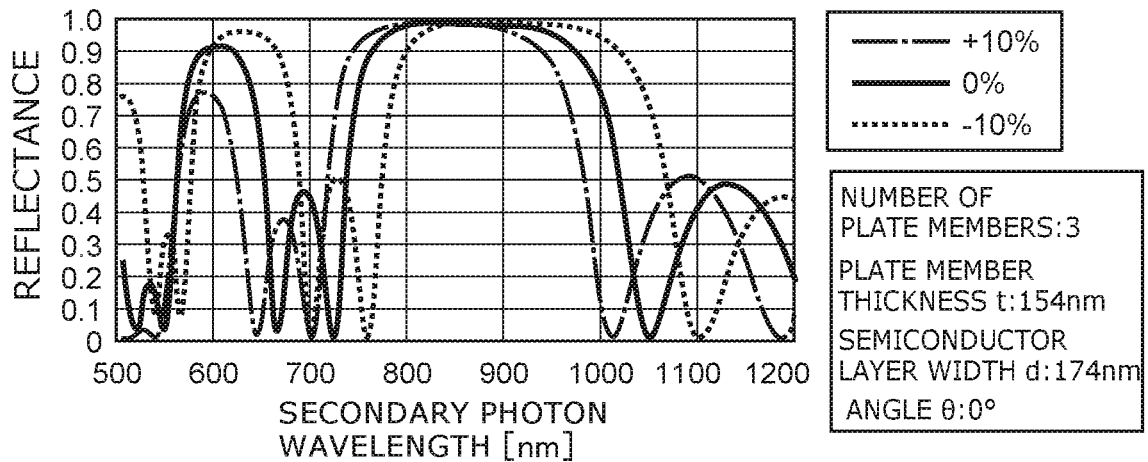
Figure 15B:
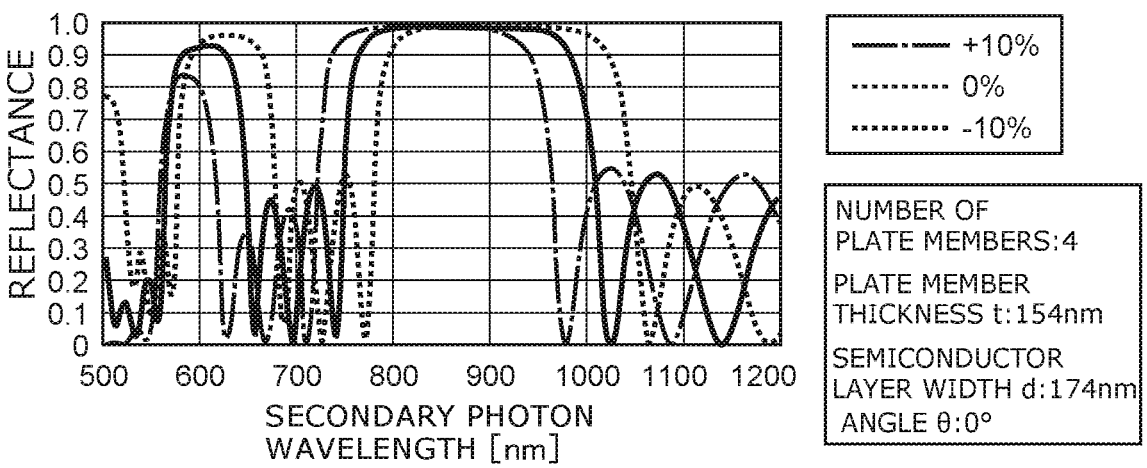

FIGS. 15A and 15B show the case where the thickness t of the plate member is 154 nm, the width d of the portion 14a of the semiconductor layer is 174 nm, and the angle θ is 0°. These values of the thickness t and the width d satisfy Formulas 1 and 2 described above when the wavelength λ of the light is 900 nm, the integer $m_1$ is 0, and the integer $m_2$ is 1. FIG. 15A shows the case of three plate members; and FIG. 15B shows the case of four plate members.

As shown in FIGS. 15A and 15B, for the conditions recited above, in the case where the thickness t and the width d are the design values (0%), the reflectance was not less than 0.95 in the range where the wavelength λ was substantially not less than 770 nm and not more than 920 nm. In the case where the thickness t and the width d were the design value+10% and the design value−10% as well, for three plate members (FIG. 15A), the reflectance was not less than 0.8 in the range where the wavelength λ was substantially not less than 790 nm and not more than 950 nm; and for four plate members (referring to FIG. 15B), the reflectance was not less than 0.8 in the range where the wavelength λ was substantially not less than 790 nm and not more than 950 nm.

Thus, according to the test example, good reflectance is obtained at the center wavelength of the secondary photon at the vicinity of 900 nm; and it was confirmed that the transmission into the adjacent cell 100 is suppressed. In particular, in the case where the integers $m_1$ and $m_2$ are 0 in Formulas 1 and 2 recited above, a high reflectance was obtained in a wide wavelength range. The dependence on the fluctuation of the dimensions also was low.

Second Test Example

A second test example will now be described.

Figure 16:
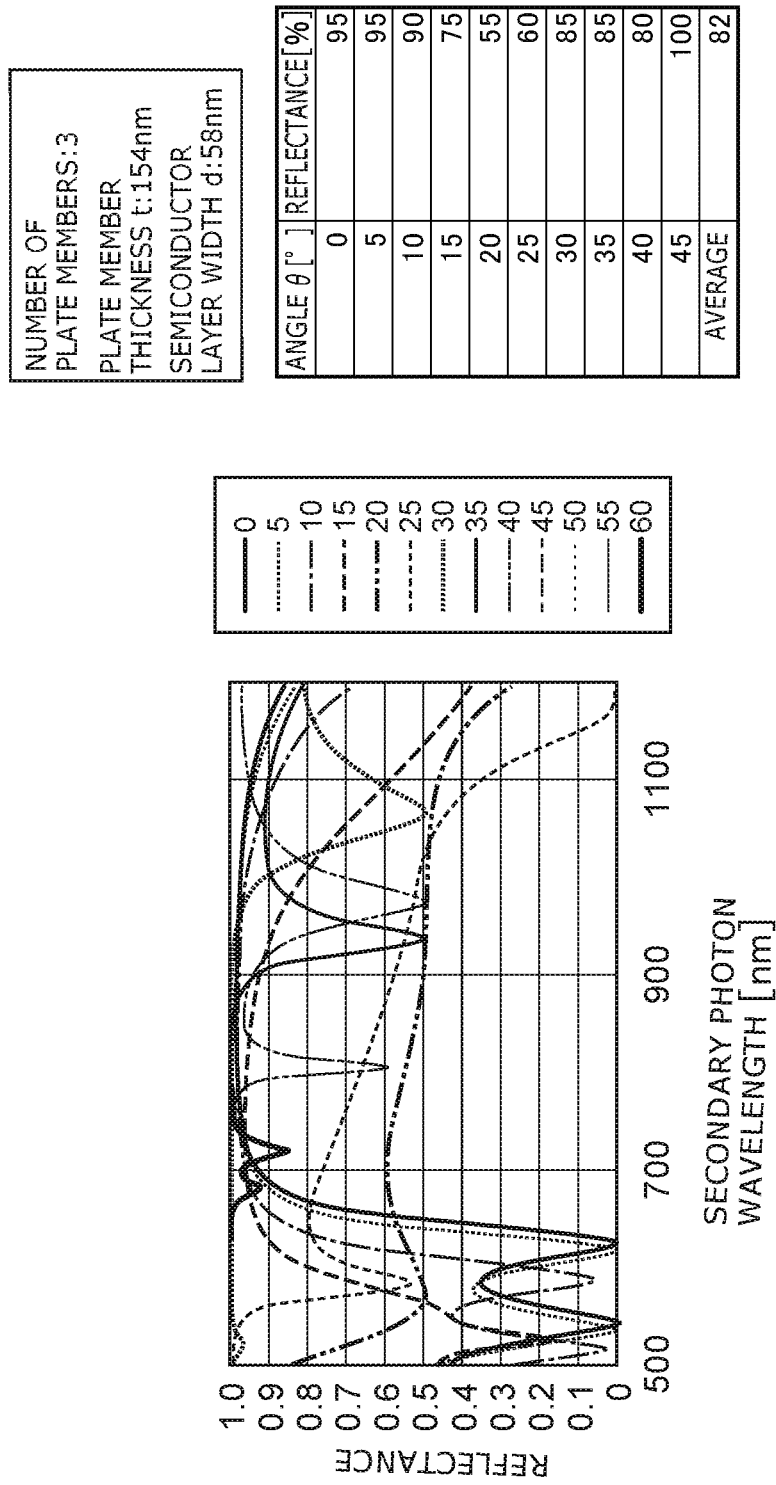
FIG. 16 and FIG. 17 are graphs and tables showing simulation results of the light reflectance of a second test example, in which a horizontal axis is a secondary photon wavelength, and a vertical axis is a light reflectance in an element separation region.
Figure 17:
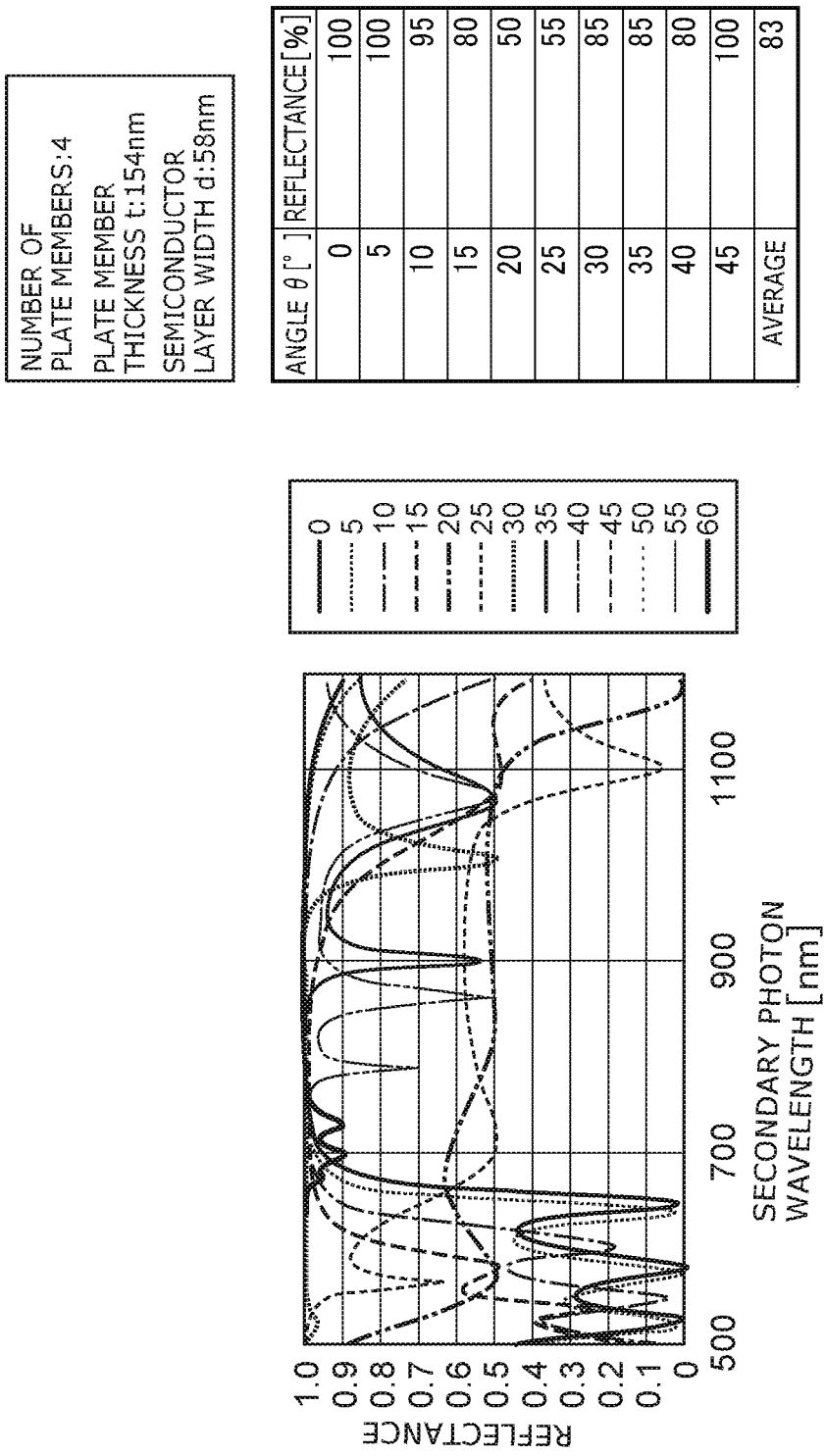

FIG. 16 and FIG. 17 are graphs and tables showing the simulation results of the light reflectance of the test example, in which the horizontal axis is the secondary photon wavelength, and the vertical axis is the light reflectance in the element separation region.

In the test example, the thickness t of the plate member was 154 nm; the width d of the portion 14a of the semiconductor layer was 58 nm; and the angle θ was changed in the range of 0 to 45°. The other conditions are similar to those of the first test example. FIG. 16 shows the case of three plate members; and FIG. 17 shows the case of four plate members.

As shown in FIG. 16 and FIG. 17, the reflectance was not less than 0.5 in the wavelength range substantially not less than 650 nm and not more than 1050 nm even when changing the angle θ of the secondary photon incident on the plate member in the range of 0 to 45°. Thus, the effect of suppressing the leakage of the secondary photons into the adjacent cell was confirmed even when the angle θ fluctuates.

According to the embodiments described above, a light detection device having high detection accuracy can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A light detection device, a first cell and a second cell being set in the light detection device, the first cell and the second cell being mutually adjacent, the light detection device comprising:
a first semiconductor layer of a first conductivity type;
a second semiconductor layer provided on the first semiconductor layer, the second semiconductor layer being of a second conductivity type;
a first member provided between the first cell and the second cell, the first member being made of a material different from the first semiconductor layer and the second semiconductor layer;
a second member provided between the first member and the first cell, the second member being made of a material different from the first semiconductor layer and the second semiconductor layer; and
a third member provided between the first member and the second cell, the third member being made of a material different from the first semiconductor layer and the second semiconductor layer,
wherein the second semiconductor layer includes:
a first region contacting the first semiconductor layer;
a second region provided on the first region, an impurity concentration of the second region being lower than an impurity concentration of the first region; and
a third region provided on the second region, an impurity concentration of the third region being higher than an impurity concentration of the second region, and
a lower end of the first member, a lower end of the second member, and a lower end of the third member are positioned lower than an interface between the second region and the third region.

2. The device according to claim 1, wherein the first member, the second member, and the third member are made of a dielectric.

3. The device according to claim 1, wherein the first member has a lattice configuration surrounding the first cell and surrounding the second cell.

4. The device according to claim 1, wherein
the second member surrounds the first cell, and
the third member surrounds the second cell.

5. The device according to claim 1, wherein the first member, the second member, and the third member are arranged periodically in a cross section including the first cell and the second cell.

6. The device according to claim 1, wherein two side surfaces of the first member, two side surfaces of the second member, and two side surfaces of the third member are orthogonal to a straight line connecting a center of the first cell and a center of the second cell.

7. The device according to claim 1, wherein the lower end of the first member, the lower end of the second member, and the lower end of the third member are positioned lower than an interface between the first semiconductor layer and the second semiconductor layer.

8. The device according to claim 1, wherein in a case that a width of a portion of the second semiconductor layer between the first member and the second member and a width of a portion of the second semiconductor layer between the first member and the third member are taken as d respectively, a refractive index of the second semiconductor layer for light entering the first cell or the second cell is taken as $n_2$, $m_2$ is an integer of 0 or more, the width d satisfies the following Formula $$d = \frac{m_2 \lambda}{2n_2} + \frac{\lambda}{4n_2}.$$

9. The device according to claim 1, wherein
the first semiconductor layer includes:
a first region;
a second region provided on the first region, an impurity concentration of the second region being lower than an impurity concentration of the first region; and
a third region contacting the second semiconductor layer, being provided on the second region, and having an impurity concentration higher than the impurity concentration of the second region, and a lower end of the first member, a lower end of the second member, and a lower end of the third member are positioned lower than an interface between the third region and the second semiconductor layer.

10. The device according to claim 9, wherein the lower end of the first member, the lower end of the second member, and the lower end of the third member are positioned lower than an interface between the first region and the second region.

11. The device according to claim 9, wherein in a case that a width of a portion of the first semiconductor layer between the first member and the second member and a width of a portion of the first semiconductor layer between the first member and the third member are taken as d respectively, a refractive index of the first semiconductor layer for light entering the first cell or the second cell is taken as $n_2$, $m_2$ is an integer of 0 or more, the width d satisfies the following Formula $$d = \frac{m_2 \lambda}{2n_2} + \frac{\lambda}{4n_2}.$$

12. The device according to claim 1, further comprising a fourth member provided between the first member and the third member, the fourth member being made of a material different from the first semiconductor layer and the second semiconductor layer.

13. The device according to claim 12, wherein the fourth member surrounds the second cell.

14. The device according to claim 1, further comprising resistance members connected to the first semiconductor layer or the second semiconductor layer respectively for the first cell and the second cell.

15. The device according to claim 1, wherein the first member, the second member and the third member have respectively a tapered configuration that becomes thinner downward in a cross section including the first cell and the second cell.

16. A light detection device, a first cell and a second cell being set in the light detection device, the first cell and the second cell being mutually adjacent, the light detection device comprising:
   a first semiconductor layer of a first conductivity type;
   a second semiconductor layer provided on the first semiconductor layer, the second semiconductor layer being of a second conductivity type;
   a first member provided between the first cell and the second cell, the first member being made of a material different from the first semiconductor layer and the second semiconductor layer;
   a second member provided between the first member and the first cell, the second member being made of a material different from the first semiconductor layer and the second semiconductor layer; and
   a third member provided between the first member and the second cell, the third member being made of a material different from the first semiconductor layer and the second semiconductor layer,
   wherein in a case that a thickness of the first member, a thickness of the second member and a thickness of the third member in a cross section including the first cell and the second cell are taken respectively as t, a wavelength of light entering the first member is taken as $\lambda$, a refractive index of the first member for the light is taken as $n_1$, and $m_1$ is an integer of 0 or more, the thickness t satisfies the following Formula $$t = \frac{m_1 \lambda}{2n_1} + \frac{\lambda}{4n_1}.$$

* * * * *